(12) United States Patent
Suzuki et al.

(10) Patent No.: US 8,405,923 B2
(45) Date of Patent: Mar. 26, 2013

(54) ELECTRON BEAM RECORDING APPARATUS, CONTROLLER FOR THE SAME, AND METHOD FOR CONTROLLING SAME

(75) Inventors: Hiroaki Suzuki, Tsurugashima (JP); Akio Fukushima, Katsushika (JP); Takayuki Kasuya, Ota (JP)

(73) Assignee: Pioneer Corporation, Kawasaki-shi, Kanagawa (JP)

( * ) Notice: Subject to any disclaimer, the term of this patent is extended or adjusted under 35 U.S.C. 154(b) by 111 days.

(21) Appl. No.: 13/057,053

(22) PCT Filed: Aug. 1, 2008

(86) PCT No.: PCT/JP2008/063908
§ 371 (c)(1),
(2), (4) Date: Apr. 8, 2011

(87) PCT Pub. No.: WO2010/013349
PCT Pub. Date: Feb. 4, 2010

(65) Prior Publication Data
US 2011/0182161 A1 Jul. 28, 2011

(51) Int. Cl.
*G11B 5/86* (2006.01)

(52) U.S. Cl. ............................... 360/16; 360/17; 360/59

(58) Field of Classification Search .................... 360/16, 360/17, 59
See application file for complete search history.

(56) References Cited

FOREIGN PATENT DOCUMENTS

| JP | 1-235047 | 9/1989 |
|---|---|---|
| JP | 1-315037 | 12/1989 |
| JP | 11-259916 | 9/1999 |
| JP | 2002-367178 | 12/2002 |
| JP | 2005-524104 | 8/2005 |
| JP | 2008-140419 | 6/2008 |
| WO | 2008/056400 | 5/2008 |

*Primary Examiner* — Wayne Young
*Assistant Examiner* — Brenda Bernardi
(74) *Attorney, Agent, or Firm* — Drinker Biddle & Reath LLP

(57) ABSTRACT

The controller includes a deflection signal generator for generating a deflection signal for causing the electron beam to deflect and perform overwriting so that a beam spot of the electron beam follows the translation of the substrate over a period during which the substrate is rotated over a predetermined number of overwriting cycles; and a data output unit for outputting the drawing data, wherein, the deflection signal generator generates a deflection adjustment signal for irradiating the electron beam at a starting position for drawing a concentric circle to be subsequently overwritten after a predetermined deflection adjustment period has elapsed since overwriting of concentric circles based on the drawing data has completed.

26 Claims, 12 Drawing Sheets

ELECTRON BEAM RECORDING APPARATUS, CONTROLLER FOR THE SAME, AND METHOD FOR CONTROLLING SAME

TECHNICAL FIELD

The present invention relates to an electron beam recording apparatus for manufacturing a master disk, and a controller for the same, and a method for controlling the same.

BACKGROUND ART

Magnetic disks or hard disks (HD) are used in, e.g., PC storing devices, portable electronic devices, or in-vehicle devices. Recently, applications of these disks have greatly expanded, and surface recording density has improved dramatically.

An electron beam mastering technique has been widely studied for manufacturing a hard disk with such a high recording density. In an electron beam drawing and exposure apparatus, an electron beam spot emitted from an electron gun and converged using an electron lens is irradiated onto a substrate coated with a resist. A blanking control system and a beam deflection control system control the irradiation position of such an electron beam spot to draw a desired beam pattern. For example, an electron beam drawing apparatus has been developed as a device for fabricating a master disk for a recording medium such as an optical disc, as mentioned, for example, in Japan Laid-open Patent Publication No. 2002-367178.

Therefore, drawing by an electron beam with high recording density requires highly precise control of the irradiation position of an electron beam spot. For a hard disk, a concentric pattern is used rather than the spiral pattern employed for an optical disc, for example. An electron beam recording apparatus capable of drawing concentric circles with high precision and having excellent control is important when drawing an electron beam pattern in concentric circles.

There is a need for a controller and a control method for an electron beam recording apparatus capable of control having high precision and a high degree of freedom.

DISCLOSURE OF THE INVENTION

An example of a problem to be solved by the present invention is to provide an electron beam recording apparatus capable of drawing concentric circles with high precision and having a high degree of freedom and excellent control; and a controller, a control method, and a computer program product for the electron beam recording apparatus.

According to the present invention, there is provided a controller of an electron beam recording apparatus for irradiating an electron beam and drawing a pattern on a substrate while the substrate is rotated and translated, the controller comprising:

a deflection signal generator for generating a deflection signal for causing said electron beam to deflect and perform overwriting so that a beam spot of said electron beam follows the translation of said substrate over a period during which said substrate is rotated over a predetermined number of overwriting cycles; and a data output unit for outputting said drawing data, wherein, said deflection signal generator generates a deflection adjustment signal for irradiating said electron beam at a starting position for drawing a concentric circle to be subsequently overwritten after a predetermined deflection adjustment period has elapsed since overwriting of concentric circles based on said drawing data has completed.

According to the present invention, there is provided a program for a computer used to control drawing by an electron beam recording apparatus for irradiating an electron beam and drawing on a substrate based on drawing data while the substrate is rotated and translated, wherein the program is designed to cause said computer to execute:

a step for generating a deflection signal for causing said electron beam to deflect and perform overwriting so that an irradiation position of said electron beam follows the translation of said substrate over a period during which said substrate is caused to rotate over a predetermined number of cycles; and for generating a deflection adjustment signal whereby said electron beam reaches a deflection position when the substrate starts rotating said predetermined number of cycles after the substrate has finished rotating said predetermined number of cycles and after a predetermined deflection adjustment period has elapsed; and a step for issuing an output command for outputting said drawing data over said predetermined number of cycles.

According to the present invention, there is provided an electron beam recording apparatus for translating a substrate along a radius direction thereof while rotating said substrate, irradiating an electron beam while deflecting the electron beam, irradiating the electron beam based on drawing data, and drawing concentric circles on said substrate, the electron beam recording apparatus comprising:

a deflection signal generator for generating a deflection signal for causing said electron beam to deflect and perform overwriting so that a beam spot of said electron beam follows the translation of said substrate over a period during which said substrate is rotated over a predetermined number of overwriting cycles;

a data output unit for repeatedly outputting said drawing data according to said number of overwriting cycles;

a rotation and translation drive unit for rotating and translating said substrate;

an electron beam deflector for deflecting said electron beam in accordance with said deflection signal; and an electron beam modulator for drawing an electron beam in accordance with the drawing data output from said data outputting section, wherein, said deflection signal generator generates a deflection adjustment signal for irradiating said electron beam at a starting position for drawing a concentric circle to be subsequently overwritten after a predetermined deflection adjustment period has elapsed since overwriting of concentric circles based on said drawing data has completed.

According to the present invention, there is provided a controller for generating a drawing Signal to an electron beam drawing device for irradiating an electron beam on a substrate that rotates, the controller comprising:

a memory for storing pattern information regarding a pattern to be drawn; and a drawing signal generator for generating a drawing signal based on said pattern information, wherein said drawing signal includes a deflection control signal for controlling deflection of an electron beam to be irradiated inside said electron beam device; and said deflection control signal includes a beam irradiation period and a beam non-irradiation period as one cycle over which said substrate performs "n" rotations, the beam irradiation period being a period during which the electron beam is irradiated on said substrate, the beam non-irradiation period being a period during which the electron beam is not irradiated on said substrate.

MODE FOR CARRYING OUT THE INVENTION

Figure 1:
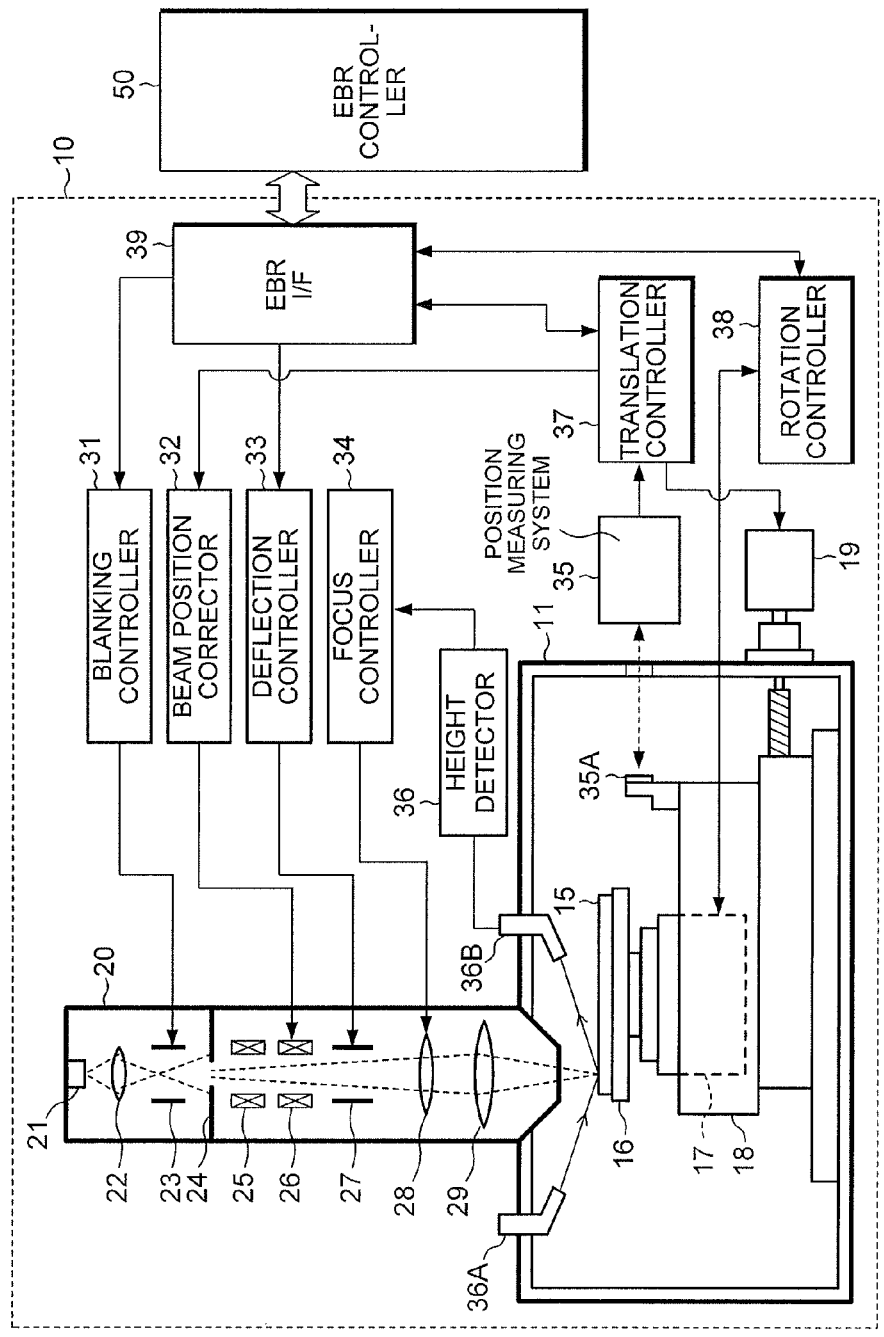
FIG. 1 is a schematic block diagram showing the configuration of an electron beam recording apparatus (EBR) according to a first embodiment of the present invention.

The preferred embodiments of the present invention are described below in detail with reference to the attached drawings. In the embodiments indicated below, equivalent components will be referenced using the same reference numerals.

First Embodiment

FIG. 1 is a schematic block diagram showing the configuration of an electron beam recording apparatus or recording apparatus (hereafter, also referred to as EBR) 10 and an EBR controller (or formatter) 50 for controlling the EBR 10. The electron beam recording apparatus 10 is an EB mastering device for fabricating a master disk for manufacturing a magnetic disk, for example, using an electron beam. The EBR controller (or formatter) 50 may be assembled with the EBR 10 to constitute the electron beam recording apparatus (EBR) 10. An example will be discussed below in which the EBR controller (hereafter, simply referred to as "formatter") 50 and the EBR 10 are connected via an interface circuit.

Configuration of the Electron Beam Recording Apparatus (EBR) 10

The EBR 10 is provided with a vacuum chamber 11, a stage driver for mounting, rotating, and translating a substrate arranged inside the vacuum chamber 11, an electron beam column 20 attached to the vacuum chamber 11, and circuits and control systems for controlling the stage driver and controlling the electron beam, for example.

More specifically, a substrate 15 for a master disk is mounted on a turntable 16. The turntable 16 is driven to rotate about a vertical axis (i.e., Z-axis) of the main surface of the disk substrate by a spindle motor 17, which is a rotation driver for causing the substrate 15 to rotate. The substrate 15 comprises, for example, a resist material photosensitive to an electron beam coated on a glass substrate or a silicon base plate. The spindle motor 17 is provided on a translation stage (hereafter, simply referred to as "stage") 18. The stage 18 is combined with a translation motor 19, which is a transporting device (or translation driver), by which the spindle motor 17 and the turntable 16 can travel in a predetermined direction in a plane parallel to the main surface of the substrate 15.

The substrate 15 is securely chucked on the turntable 16. The turntable 16 is made of a dielectric material such as a ceramic, and has an electrostatic chucking mechanism (not shown). Such an electrostatic chucking mechanism is provided with a turntable 16, and an electrode disposed inside the turntable 16, the electrode comprising a conductor for producing electrostatic polarization. A high-voltage power supply (not shown) is connected to the electrode, and the substrate 15 is chucked by applying a voltage from the high-voltage power supply to the electrode.

Optical elements such as an interferometer and a reflecting mirror 35A, which is a section of a laser position measuring system 35 to be discussed further below, are arranged on the stage 18.

The vacuum chamber 11 is mounted on a vibration-damping pedestal (not shown), such as an air damper, to suppress transmission of external vibration. The vacuum chamber 11 is connected to a vacuum pump (not shown), by which the interior of the chamber is evacuated to create a vacuum atmosphere of predetermined pressure inside the vacuum chamber 11.

An electron gun (emitter) 21 for emitting an electron beam, a converging lens 22, a blanking electrode 23, an aperture 24, a beam deflection coil 25, an alignment coil 26, a deflection electrode 27, a focus lens 28, and an objective lens 29 are arranged inside the electron beam column 20 in the stated order.

The electron gun 21 emits an electron beam (EB) accelerated to several tens of kilo-electron volts (KeV) by an anode (not shown), to which is applied a high voltage supplied by an acceleration high-voltage power supply (not shown). The converging lens 22 converges an emitted electron beam. The blanking electrode 23 switches an electron beam between on and off states (ON/OFF) based on a modulation signal from a blanking controller 31. Specifically, applying a voltage between blanking electrodes 23 greatly deflects an electron beam passing therethrough, whereby the electron beam is prevented from passing through the aperture 24 to produce an OFF state in which irradiation of the electron beam on the substrate 15 is discontinued (i.e., non-irradiation state).

The alignment coil 26 corrects the position of an electron beam based on a correction signal from a beam position corrector 32. The deflection electrode 27 can control deflection of an electron beam at high speed based on a control signal from a deflection controller 33. The deflection control controls the position of an electron beam spot on the substrate 15. The focus lens 28 controls the focus of an electron beam based on a control signal from a focus controller 34.

A light source 36A and a photodetector 36B, for detecting the height of the main surface of the substrate 15, are disposed in the vacuum chamber 11. The photodetector 36B, which includes, for example, a position sensor and a CCD (charge coupled device), detects an electron beam (laser light) emitted by the light source 36A and reflected by the surface of the substrate 15, and supplies the detection signal to a height detector 36. The height detector 36 detects the height of the main surface of the substrate 15 based on the detection signal, and generates a detection signal. The detection signal, which represents the height of the main surface of the substrate 15, is supplied to the focus controller 34, and the focus controller 34 adjusts the focus of the electron beam based on the detection signal.

The laser position measuring system 35 uses a laser light for measurement emitted by a light source inside the laser position measurement system to measure the distance to the stage 18, and sends the measurement data; i.e., position data for the stage 18, to a translation controller 37.

The translation controller 37 controls translation of an X-stage synchronized with a translation clock signal (T-CLK), which is a reference signal supplied by the formatter 50. The translation controller 37 also generates a translation error signal based on the stage position data from the laser position measuring system 35, and transmits this signal to the beam position corrector 32. Based on the translation error signal, the beam position corrector 32 corrects the position of an electron beam as discussed earlier. The translation controller 37 also generates a control signal for controlling a translation motor 19, and supplies this signal to the translation motor 19.

A rotation controller 38 controls rotation of the spindle motor 17 synchronized with a rotation clock signal (R-CLK) F5, which is a reference signal supplied by the formatter 50. More specifically, a rotary encoder (not shown) is disposed in the spindle motor 17, and generates a rotation signal when the spindle motor 17 rotates the turntable 16 (i.e., the substrate 15). The rotation signal includes an origin signal representing a reference rotation position of the substrate 15, and pulse signals (i.e., rotary encoder signals) at every predetermined rotation angle from the reference rotation position. The rotation signal is supplied to the rotation controller 38. The rotation controller 38 detects a rotation error of the turntable 16 based on the rotary encoder signal, and corrects the rotation of the spindle motor 17 based on the detected rotation error.

Various control signals are supplied to an EBR interface circuit (EBR I/F) 39 through a formatter interface circuit 54 of the EBR controller 50. More specifically, a modulation signal F1 and a deflection signal F3 are supplied from the EBR controller 50. The blanking controller 31 performs blanking control (i.e., control of the electron beam between ON/OFF states) based on the modulation signal F1, and the deflection controller 33 performs deflection control of the electron beam based on the deflection signal F3. The control signals supplied from the EBR controller 50 and the operation of the EBR controller 50 based on these control signals will be discussed in detail hereunder.

Configuration of the Formatter 50

Figure 2:
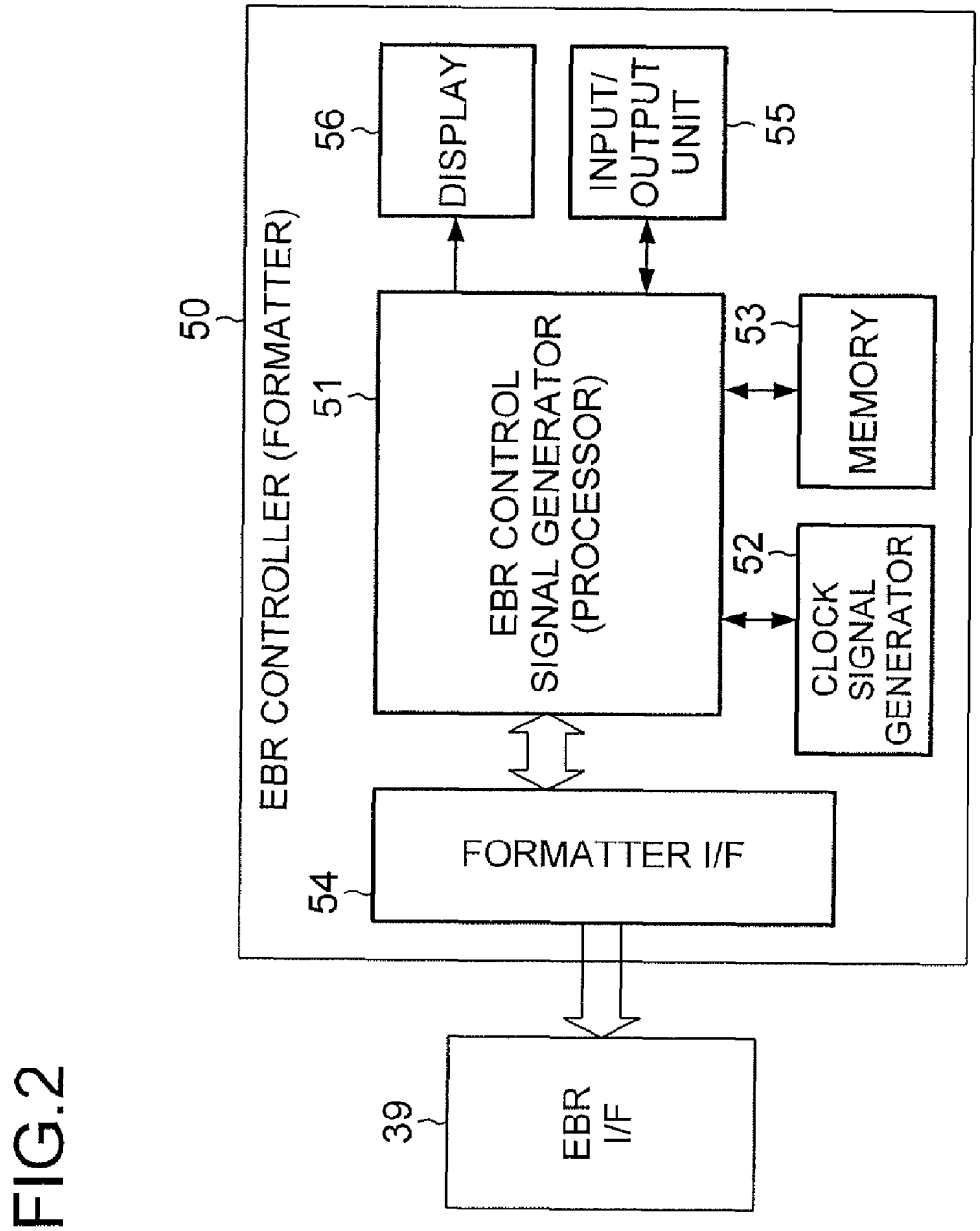
FIG. 2 is a schematic block diagram showing the configuration of the formatter shown in FIG. 1.

Next, the formatter 50, which is the controller of the EBR 10, will be discussed in greater detail referring to FIG. 2. The formatter 50 has a control signal generator (processor) 51 for generating a control signal for controlling the EBR 10, and a formatter interface circuit (formatter I/F) 54. Specifically, the control signal and the control data generated by the control signal generator 51 are delivered through the formatter interface circuit 54 to the EBR 10.

A clock signal generator 52 for generating various clock signals, to be discussed further below, is disposed in the formatter 50. The clock signal generator 52 generates clock signals in accordance with CLV (constant line velocity) drawing and CAV (constant angular velocity) drawing, for example. Specifically, as will be discussed in detail further below, the clock signal generator 52 generates a rotation clock and a translation clock representing the driving amounts of the spindle motor 17 and the translation motor 19.

The formatter 50 also includes a memory 53 for storing settings related to the various control signals to be discussed further below and data or drawing patterns to be drawn, and an input/output unit 55 for inputting settings used for controlling the EBR 10, for example. The memory 53 stores, for example, drawing pattern data (such as concentric patterns, track area patterns, and servo area patterns) for hard disks such as discrete track media or bit patterned media. The processor 51 uses these drawing pattern data to generate a control signal for the EBR 10.

A display unit 56 for displaying operating conditions, operating states, and settings of the EBR 10 and the formatter 50, for example, is also disposed in the formatter 50.

Next, the various control signals (or interface signals) between the formatter interface circuit (formatter I/F) 54 and the EBR interface circuit (EBR I/F) 39 disposed in the EBR 10, which are used for controlling the EBR 10, and their operation will be discussed.

[F1-modulation signal (F1-Modulation(/Blanking))]: Referred to hereunder as "modulation signal F1"

A signal output from the formatter to turn the electron beam on or off. For example, when the signal is "Low", the electron beam is blanked and the electron beam is turned off.

[F3-sawtooth deflection signal (F3-Sawtooth-Deflection-X)]: Referred to hereunder as "sawtooth deflection signal F3" or simply "deflection signal F3" hereunder.

A deflection signal for making a spiral a concentric circle. The polarity of the lamp wave must be inverted in accordance with the direction in which the X-stage is moved.

[F4-translation clock signal (F4-Translation-Clock)]: Referred to hereunder as "translation clock signal F4" or simply "translation clock F4."

A reference signal output from the formatter to the X-stage. The EBR drives the translation stage (or X-stage) synchronized with this signal. The pulse reference unit ($\Delta X$) may be set using the formatter. The default is 632.991345/1024 nm, for example. Units such as $\Delta X/2$, $\Delta X/4$, or $\Delta X/8$ may also be set.

[F5-rotation clock signal (F5-Rotation-Clock)]: Referred to hereunder as "rotation clock signal F5."

A reference signal output from the formatter to the rotation spindle. The default is 3600 pulse/rev, for example. The duty is 50%, for example.

[F6-start signal (F6-/Start)]: Referred to hereunder as "drawing start signal F6" or simply "start signal F6."

After a drawing end signal F7 (discussed below) is set to "high" and the translation clock signal F4 and the rotation clock signal F5 became valid, the EBR synchronizes with these signals, and the EBR sets the drawing start signal F6 to "low" at the point when the drawing start radius is reached. As a result, the formatter starts (i.e., outputting a signal for) drawing.

[F7-end signal (FF-7-End)]: Referred to hereunder as "drawing end signal F7" or simply "end signal F7"

The formatter notifies the EBR that drawing (outputting of a signal) has ended by setting this signal to "high". The signal is set to "low" during the time period when the translation clock signal F4 and the rotation clock signal F5 are valid. Upon receiving this signal, the EBR sets the drawing start signal F6 to "high" to end drawing the current task. [F8-beam outer-radius direction offset signal (F8-BeamOffsetOut]: Referred to hereunder "outer-radius direction offset signal F8" or "high-speed offset (+) signal F8"

A signal for offsetting a beam toward the outer circumference at high speed. [F9-beam inner-radius direction offset signal (F8-BeamOffsetOut)]: Referred to hereunder "inner-radius direction offset signal F9" or "high-speed offset (−) signal F9"

A signal for offsetting a beam toward the inner circumference at high speed.

The above are the main interface signals, but matters such as the numerical values and the logical levels ("high", "low") given above are merely examples, and can be set or changed as appropriate.

Operation of the EBR 10 and the Formatter 50

Figure 3:
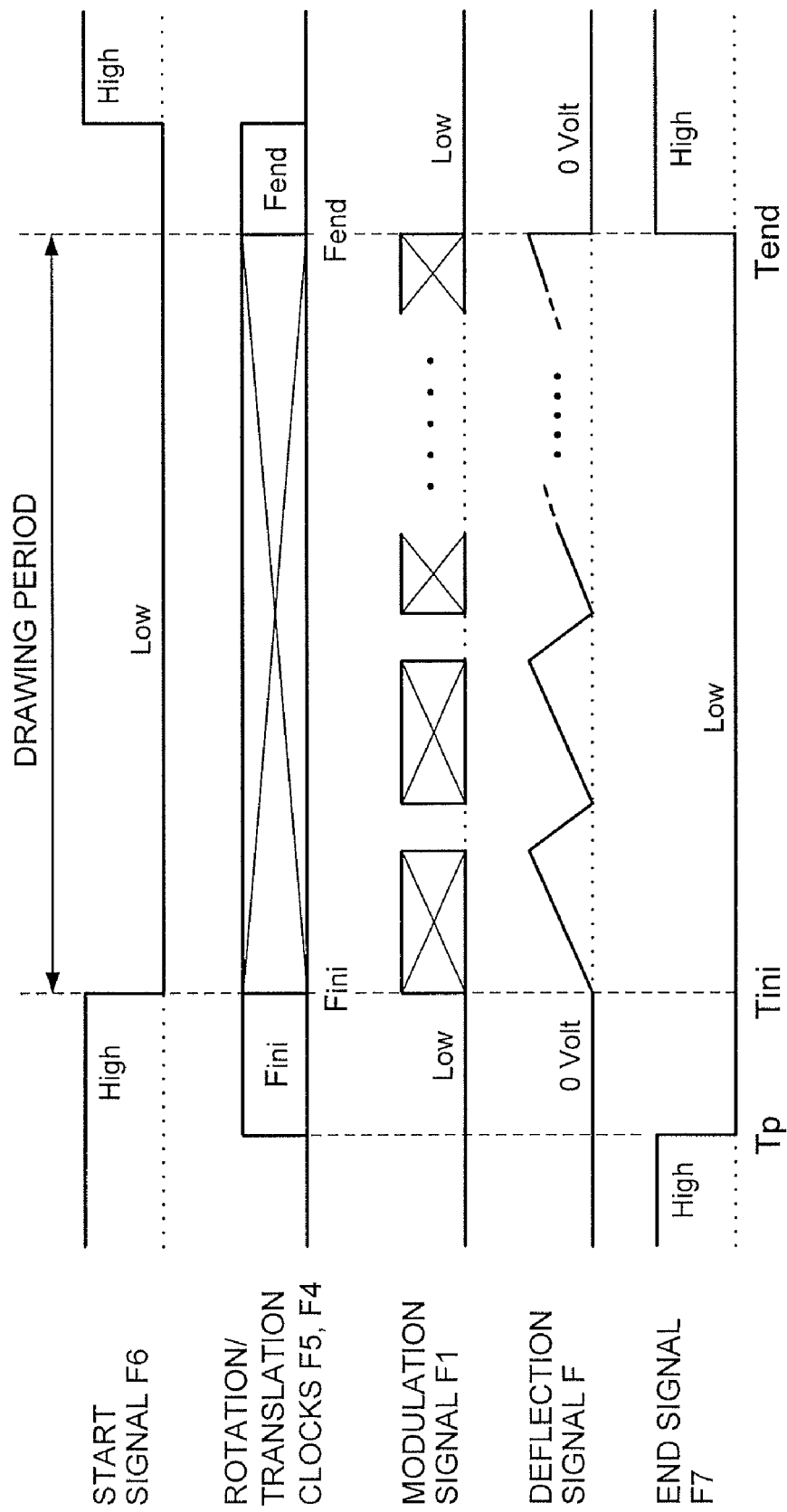
FIG. 3 is a view showing a sequence of drawing by the EBR under the control of the formatter.

Next, the operation of the EBR 10 and the formatter 50 will be discussed. FIG. 3 is a diagram showing the sequence of drawing performed by the EBR 10 under the control of the formatter 50.

Before a drawing task commences, the formatter 50 sets the drawing end signal F7 (F7-End) to "low" and outputs the translation clock signal F4 and the rotation clock signal F5 (FIG. 3, time Tp). The translation clock signal F4 and the rotation clock signal F5 at this time are clock signals of the frequency (Fini) when starting a drawing task.

After the translation clock signal F4 and the rotation clock signal F5 have been made valid (signal outputs), the EBR 10 operates in synchronization with these clocks, and at the point when the drawing start radius is reached, the EBR 10 sets the drawing start signal F6 (F6-/Start) to "low" (active).

The formatter 50 starts drawing in response to the start signal F6 becoming active. Specifically, the formatter starts outputting the modulation signal F1, which is a drawing signal (FIG. 3, timing "Tini")

Next, the control operation of the formatter 50 during drawing will be discussed referring to the accompanying drawings. The EBR 10 draws a track of concentric circles under the control of the formatter 50, but carries out a plurality of cycles of drawing (i.e., overwriting) in one track. In the embodiment, description will be made for a case in which the EBR 10 overwrites three cycles ($N_{OL}$=3) per track.

Figure 4:
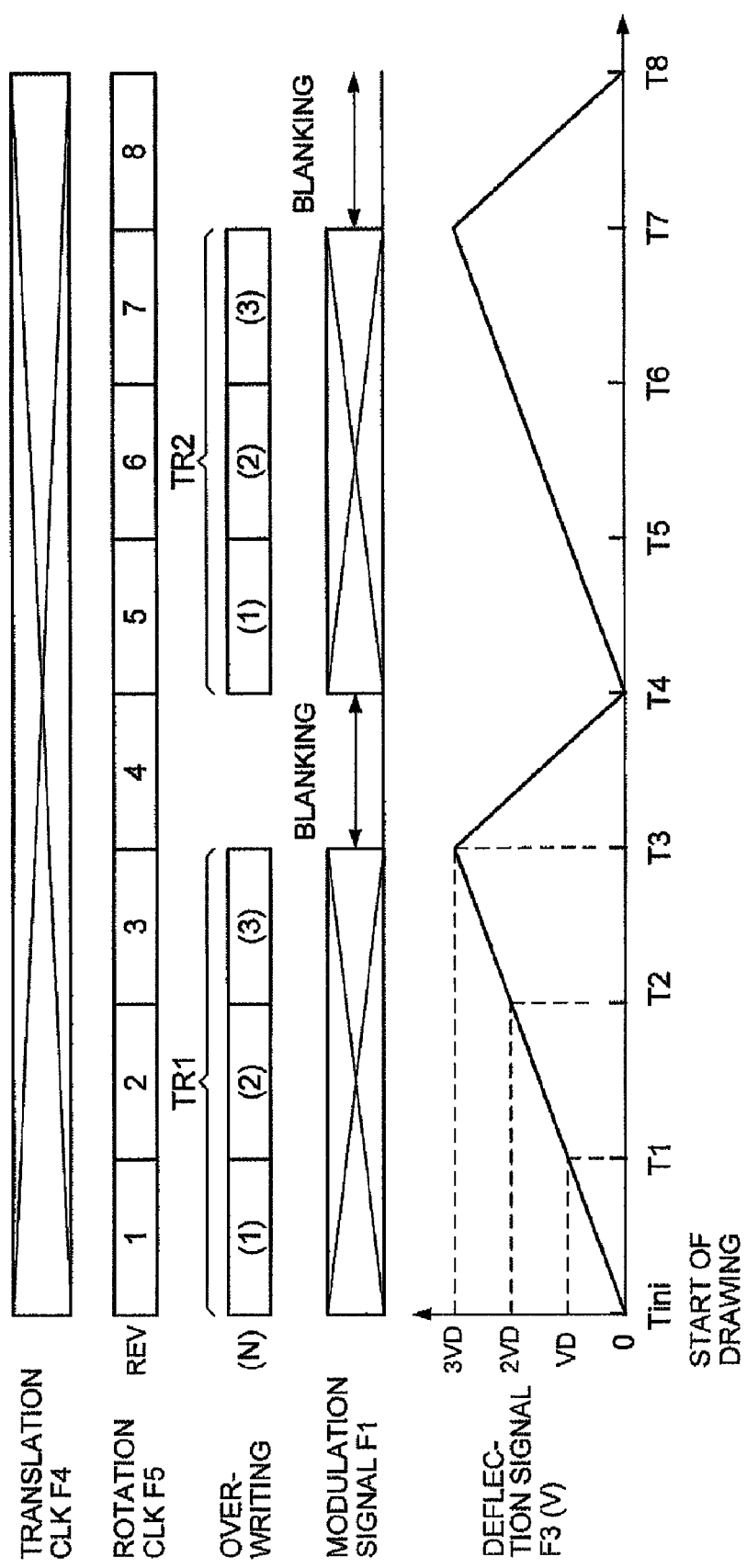
FIG. 4 is a time chart showing control by the formatter according to the first embodiment of the present invention.

FIG. 4 is a is a time chart showing control of the formatter 50; specifically, the relation between the number of rotations (REV) of the substrate 15 and the electron beam deflection signal F3 at the point when drawing starts (Tini) and thereafter. The formatter 50 outputs the translation clock (T-CLK) F4 and the rotation clock (T-CLK) F5. FIG. 4 shows the waveform of the period during which the substrate 15 rotates eight times (REV=1 to 8).

During this rotation, the deflection signal F3 is a sawtooth signal (analog voltage signal; and, during the time that the substrate 15 rotates three times (Tini to T3), changes linearly from a reference voltage (V=Vref=0 volt) to V=3*VD (i.e., 1 VD per rotation). The electron beam is in the reference deflection position (i.e., perpendicular to the substrate 15) while the deflection signal F3 is the reference voltage Vref (=0 volt).

One cycle of the deflection signal F3 is from the interval T1 to T3 (i.e., the overwriting interval) and the interval T3 to T4 (i.e., the adjustment interval), and this cycle is output repeatedly. The overwriting period is a period for at least two rotations.

Figure 5:
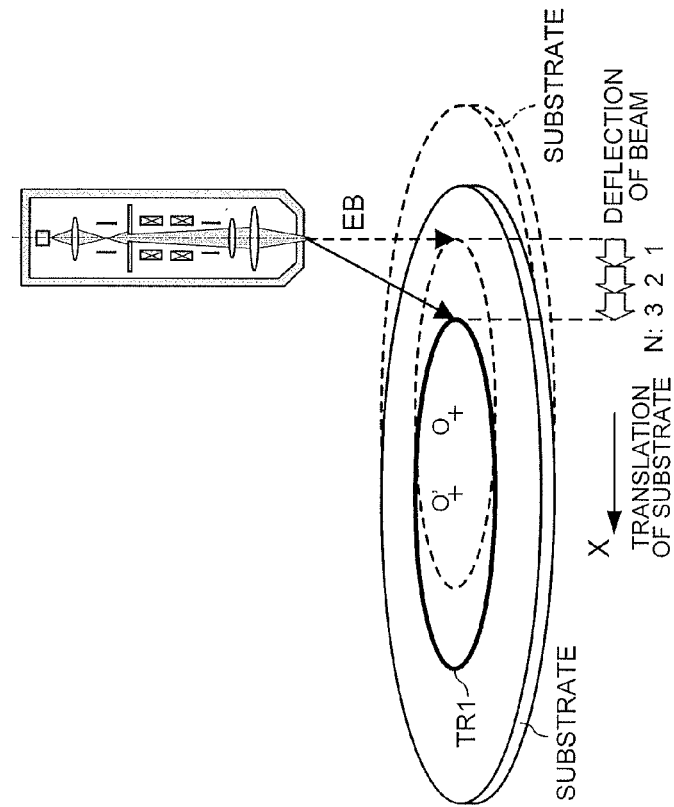
FIG. 5 is a view illustrating deflection control of an electron beam relative to translation of a substrate.
Figure 6:
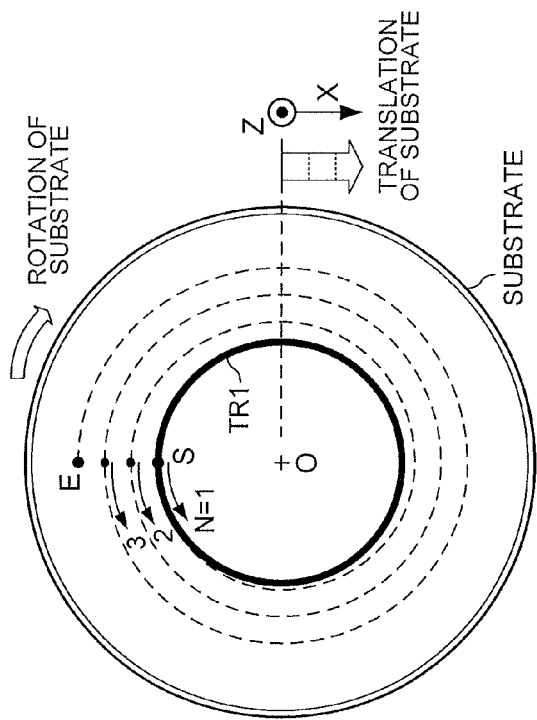
FIG. 6 is a top elevation view of a substrate, and illustrates deflection control of a formatter for overwriting and drawing a spiral beam track (dotted line) as a concentric beam track (solid line) on a track TR1.

As shown in FIG. 5, the substrate 15 is translated from a drawing start position (shown by the dotted line, where the center of the substrate is indicated as O) to the position at the end of three rotations (shown by the solid line, where the center of the substrate is indicated as O'). At this time, the electron beam EB is deflected so as to track the substrate 15 according to the deflection signal F3. Specifically, as shown in FIG. 6, were the deflection (i.e., the emission direction) of the electron beam EB fixed, the beam track on the substrate 15 would be a spiral (shown by the dotted line), but under the control of the formatter 50 (the deflection signal F3), the EBR 10 draws a concentric track TR1 (shown by the solid line).

Based on the driving amount and the number of pulses indicated by the rotation clock F5 and the translation clock F4, the formatter 50 controls the electron beam so as to deflect the beam spot to the same radial position and angle position (r, θ) relative to the center of the substrate 15 (so as to track the substrate 15).

By outputting the same data (modulation signal F1) from the formatter 50 in each of the first to the third rotations (REV=1 to 3) of the substrate 15, a track TR1 is drawn by overwriting the same data three times (N=3; that is N=1 to 3).

In other words, the beam spot of the electron beam EB is deflected so as to be in accordance with the direction and speed of translation of the substrate 15. So controlling the beam to deflect fixes the beam spot of the electron beam EB on the substrate 15 at the same radial position and angle position (r, 0) relative to the center of the substrate 15, thus overwriting and drawing a concentric track TR1 (first track). The number of overwriting cycles can be set as desired, for example, by inputting a settings file from an input/output unit 55. The distance that the substrate 15 is translated during one rotation is adjusted in accordance with the set number of overwriting cycles. For example, when the number of overwriting cycles is set to three, the distance that the substrate 15 is translated during one rotation is set to one-third of the track pitch.

The number of overwriting cycles required varies depending, for example, on the type of resist material coated on the substrate and the length of time of the developing step. Therefore, being able to set the number of overwriting cycles as desired allows flexible handling during manufacture of a master disk.

Figure 8:
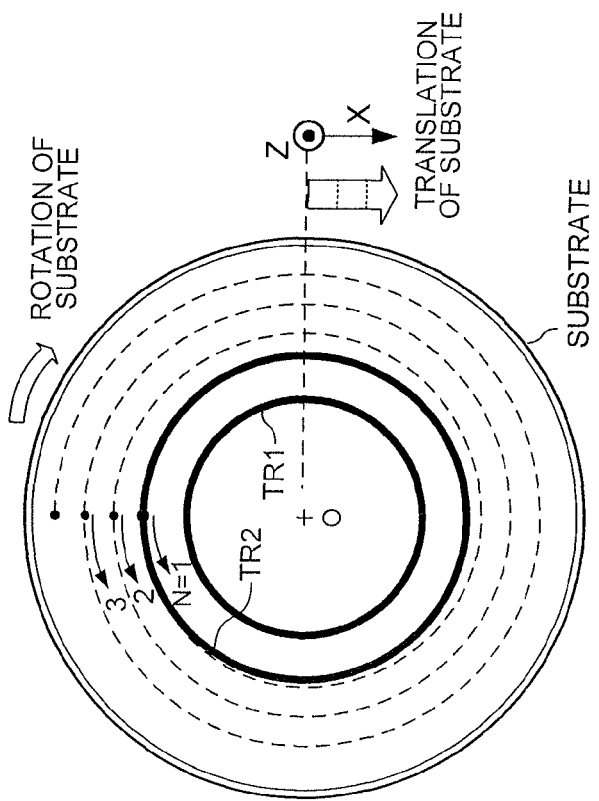
FIG. 8 is a schematic diagram illustrating track dose and track pitch.

As shown in FIG. 8, the dose amount of the track TR1 can be increased to three times the dose when not overwriting (N=1). Noise and random components during drawing can be eliminated, and highly precise drawing can be carried out with a high S/N ratio.

At the point when overwriting and drawing the first track TR1 ends (T=T3), the deflection signal F3 is returned to the reference voltage (V=Vref=0 volt; FIG. 4) for the period of one rotation (T=T3 to T4). Rather than returning the deflection voltage abruptly to the reference voltage during the interval from T3 to T4, a portion of the interval T3 to T4 or the entire interval is preferably used to gently return the deflection signal F3 to the reference voltage so as not to adversely affect the drawing pattern when drawing restarts in the next drawing cycle. More specifically, during such a period ΔT of the deflection adjustment (hereinafter, also referred to as the "deflection adjustment period"), the deflection signal F3 (hereinafter, also referred to as the "deflection adjustment signal") is a signal that varies the deflection voltage linearly from the deflection voltage at the point when overwriting and drawing ends (T=T3) to the point when overwriting and drawing starts (T=T0). In other words, the deflection signal F3 is a sawtooth signal from the start of overwriting and drawing to the start of overwriting and drawing the next track. During this deflection adjustment period, the electron beam is blanked (the modulation signal F1 is "low" or off) (FIG. 4).

Specifically, the electron beam is returned to a reference deflection position (for example, perpendicular to the substrate 15), and the beam spot of the electron beam EB is returned to the same angle position relative to the center of the substrate 15 as the angle position when drawing of the track TR1 ended. The radial position of the beam spot relative to the center of the substrate 15 at this time shifts by as much as the translation distance required to translate from overwriting of the track TR1 to the next track position. As shown in FIG. 8, this distance is the spacing p1 between tracks (called the "track pitch").

The formatter 50 performs the same control during the fourth to the sixth rotations (REV=5 to 7) of the substrate 15 as during the first to the third rotations (REV=1 to 3). As a result, the track TR2 is drawn by overwriting the same data three times ($N_{OL}=3$).

Figure 9:
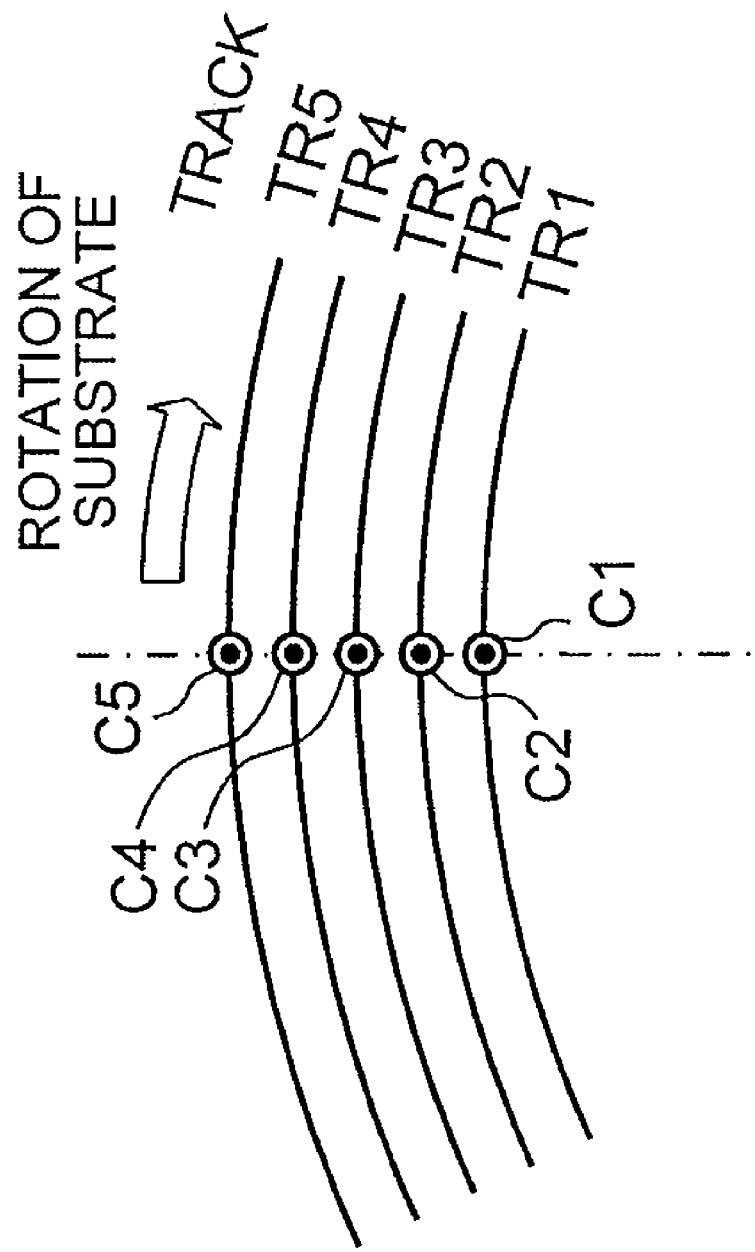
FIG. 9 is a schematic view showing tracks drawn as circles accurately connected at connecting points Ci (i=1 to 5)

As discussed earlier, returning the deflection of the electron beam EB to a reference position over a period of one rotation (i.e., a blank period with no drawing) when drawing a track can accurately connect the track. Specifically, as shown in FIG. 9, the tracks are drawn as circles accurately connected at connecting points Ci (i=1 to 5). The connecting points Ci are located not just where a starting point overlaps an end point while drawing concentric circles, but also in a connecting area a predetermined distance apart from the starting point and the end point. In this embodiment, the connecting points Ci are on the same radius (the same angle position) of the substrate 15.

Figure 7:
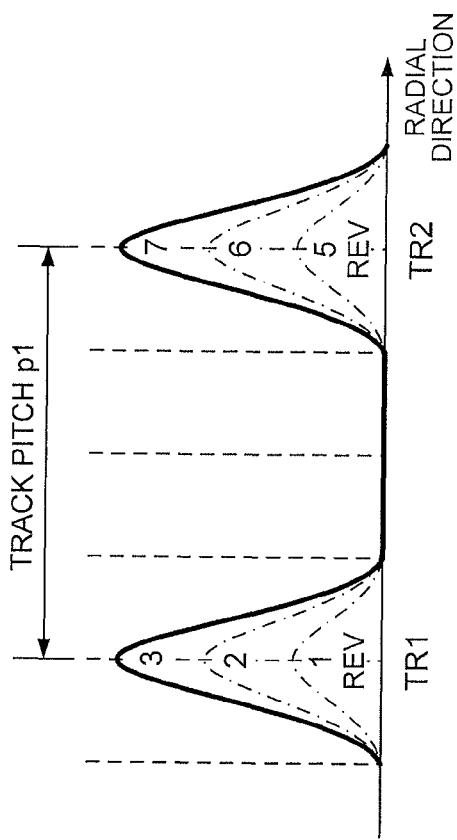
FIG. 7 is a view similar to FIG. 6, and illustrates overwriting and drawing a second concentric track TR2 after overwriting and drawing a concentric track TR1.

When the drawing mode is CLV (constant line velocity), the formatter 50 outputs a rotation clock F5 for varying the number of revolutions of the substrate 15 in accordance with the radial position. Because the data length, marks, and space length for one rotation differ depending on the track length, a modulation signal F1 adjusted for the drawing data is output. Controlling by the formatter 50 in this way overwrites and draws a concentric second track TR2 separated by as much as the track pitch discussed earlier as shown in FIGS. 7 and 9.

The beam deflection control by the formatter 50 discussed earlier is performed repeatedly to overwrite and draw a first track TR1, a second track TR2, a third track TR3, ... (FIG. 3).

Such beam deflection control can be applied to different drawing modes, such as CLV (constant line velocity) drawing or CAV (constant angular velocity) drawing.

The sawtooth deflection signal F3 discussed earlier may be selected appropriately in accordance with the drawing mode (such as CLV or CAV). Specifically, the slope of the sawtooth signal (analog voltage signal) corresponding to the first track TR1, the second track TR2, ... may be modified so that the irradiation position of an electron beam tracks the translation of the substrate 15 in accordance with the drawing mode.

When a set drawing task has ended, the formatter 50 sets the drawing end signal F7 (to be discussed further below) to "high" to notify the EBR 10 that drawing has ended (T=Tend, FIG. 3). After receiving this signal, the EBR 10 sets the drawing start signal F6 to "high" to end drawing the current task.

Second Embodiment

Figure 10:
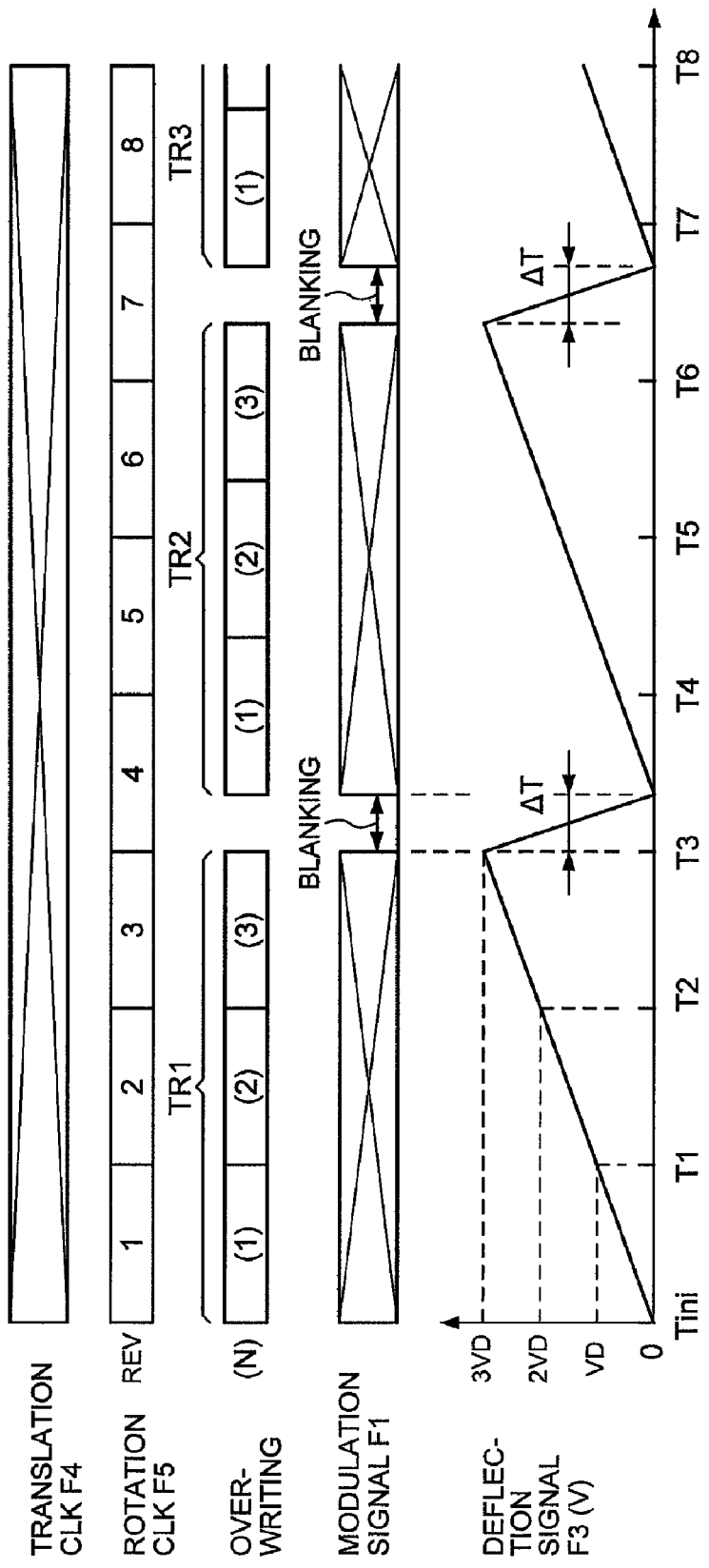
FIG. 10 is a time chart showing control by a formatter according to a second embodiment of the present invention.

FIG. 10 is a time chart showing control by the formatter 50 according to a second embodiment of the present invention. As with the first embodiment, the formatter 50 controls deflection of an electron beam so that the beam spot tracks the substrate 15. Specifically, during the first to third rotations (REV=1 to 3) of the substrate 15, the formatter outputs the same data (deflection modulation signal F1) to draw the track TR1 by overwriting the same data three times ($N_{OL}=3$).

In the first embodiment, a period of one rotation of the substrate 15 (T=T3 to T4) was inserted as a period for returning the deflection voltage to the reference voltage (V=Vref=0 volt) after drawing of the track TR1 has ended. In the present embodiment, however, there is inserted a predetermined deflection adjustment period ($\Delta T$) which is not limited to a period of one rotation. This deflection adjustment period ($\Delta T$) is preferably shorter than the period of one rotation of the substrate 15.

Specifically, during the deflection adjustment period ($\Delta T$), the electron beam is blanked (i.e., the modulation signal F1 is "low" or off), and the deflection signal F3 returns the electron beam to the reference deflection position (the deflection position at the starting point of overwriting and drawing).

After a delay of as much as the deflection adjustment period ($\Delta T$) from the start of the fourth rotation (REV=1 to 3) of the substrate 15, the formatter 50 performs the same control as during the first to the third rotations (REV=1 to 3). As a result, the track TR2 is drawn by overwriting the same data three times ($N_{OL}=3$).

Figure 12:
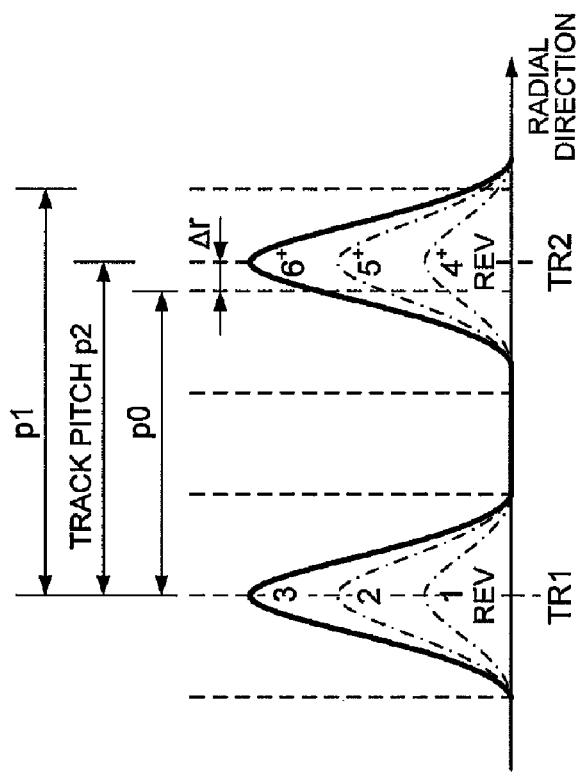
FIG. 12 is a schematic diagram showing track dose and track pitch in the second embodiment.
Figure 11:
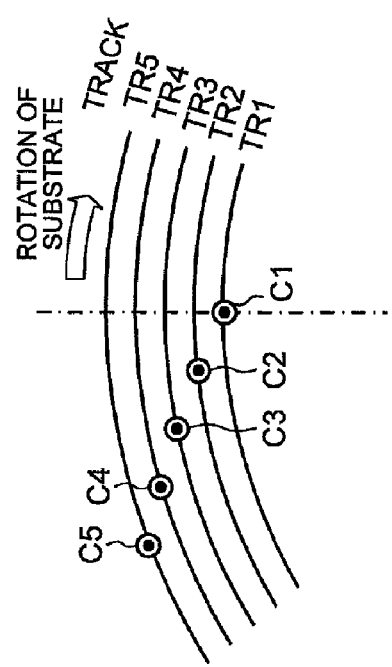
FIG. 11 is a schematic view showing the connecting points of tracks in the second embodiment.

According to the control, the track TR2 is drawn as a circle accurately connected at the connecting point C2 as shown in FIG. 11. This connecting point C2 is a position that has been shifted in angular position by $\Delta\theta$ ($=v*\Delta T/r$, where v is the linear velocity and r is the radial position) from the connecting point C1 of the track TR1. As shown in FIG. 12, the track pitch p2 is greater than the track pitch p0 when no deflection adjustment period ($\Delta T$) is inserted by the distance that the substrate 15 translates during the deflection adjustment period ($\Delta T$).

The above-described control by the formatter 50 is performed repeatedly to overwrite and draw a first track TR1, a second track TR2, a third track TR3, .... Although the connecting points Ci (i=1, 2, ...) of these tracks are shifted from each other as discussed earlier, each track is drawn as a circle accurately connected at the connecting point Ci.

Although the connecting points Ci (i=1, 2, ...) of the tracks may be formed in positions shifted tangentially without being in arrangement in the same radial direction, the connecting points Ci are preferably in positions corresponding to the starting point of a sector or a boundary between sectors, for example. The reason is that drawing is easier to control when the connecting points Ci are on drawing reference positions related to the drawing data.

Although the tracks can be connected well at the connecting points Ci by controlling by the formatter 50 in this way, slight errors may occur. Therefore, the connecting points Ci are preferably set within a specific area of the substrate; for example, an area where low precision is permitted. An "area where low precision is permitted" is, for example, a preamble area for detecting a clock, or an address area. Because a preamble area is disposed continuously radially, setting a connecting point Ci within a preamble drawing area has no adverse effect even if there is a slight error in connecting concentric tracks.

The dose of each track Tri (i=1, 2, can be increased to $N_{OL}$ times the dose amount when not overwriting (where $N_{OL}$ is an integer of 2 or greater, which can be set as desired), noise or random components during drawing can be eliminated, and highly precise drawing can be carried out with a high S/N ratio.

Third Embodiment

Figure 13:
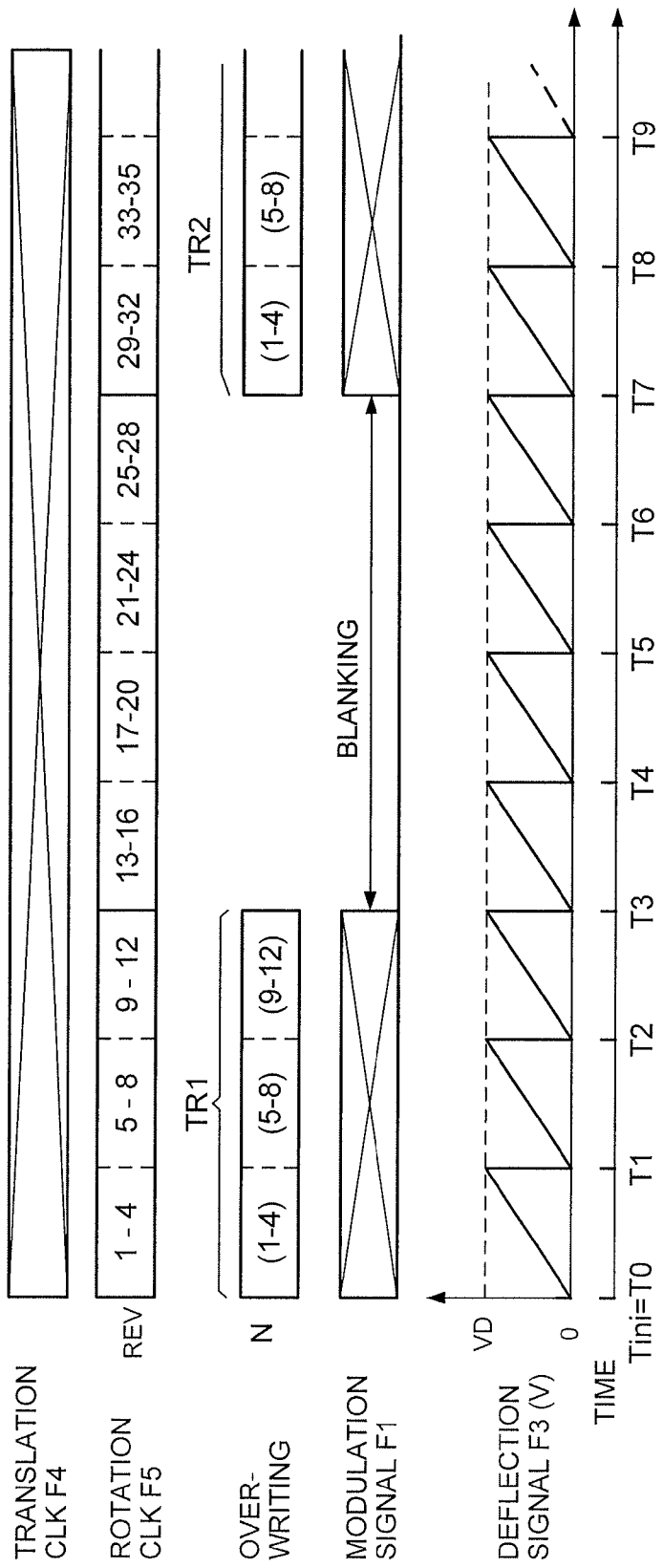
FIG. 13 is a time chart showing control by a formatter according to a third embodiment of the present invention.

FIG. 13 is a time chart showing control by a formatter 50 according to the third embodiment of the present invention. Like the embodiments discussed earlier, the formatter 50 controls deflection of an electron beam so that the beam spot tracks the substrate 15.

The formatter 50 outputs the deflection signal F1 during the period T=T0 to T1 of the first to fourth rotations (REV=1 to 4) of the substrate 15. The deflection signal F3 is a sawtooth signal (analog voltage signal), and changes linearly from a reference voltage (V=Vref=0 volt) to V=VD during the period that the substrate 15 rotates four times (REV=1 to 4). That is, the electron beam is deflected by the deflection signal F3 so as to track the substrate 15. During the period T=T0 to T1 of the first to the fourth rotations (REV=1 to 4) of the substrate 15, the formatter 50 outputs the same data (modulation signal F1) at each rotation of the substrate 15 to draw by overwriting four times ($N_{OL}$=4) (line LN1, FIG. 14).

Figure 14:
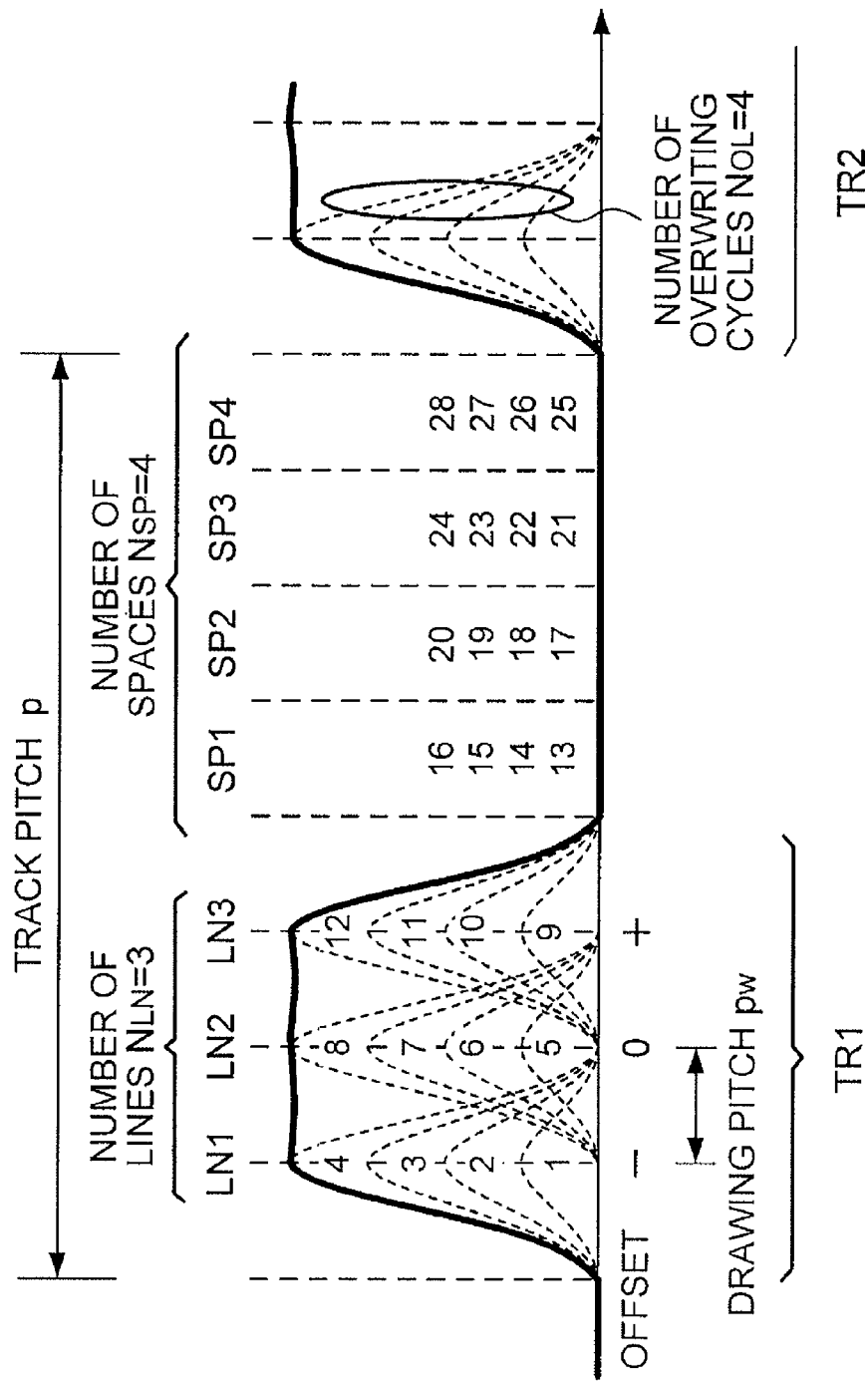
FIG. 14 is a schematic diagram illustrating tracks, line doses, and track pitch in the second embodiment.

At time T1, the deflection signal F3 is returned to the reference voltage Vref (=0 volt), the electron beam is returned to the deflection position when starting to draw the LN1 (the reference deflection position), and the beam spot of the electron beam is returned to the same angle position relative to the center of the substrate 15 as the angle position when drawing of the track LN1 ended. The radial position of the beam spot relative to the center of the substrate 15 at this time shifts by the translation distance required to draw the line LN1. As shown in FIG. 14, this distance is the spacing pw between lines (referred to as the "line pitch" or "drawing pitch").

During the period T=T1 to T2 of the fifth to the eighth rotations (REV=5 to 8) and the period T=T2 to T3 of the ninth to the twelfth rotations (REV=9 to 12) of the substrate 15, the formatter 50 outputs the deflection signal F3 to deflect the beam so as to track the substrate 15 in the same way as during the first to the fourth rotations (REV=1 to 4). Specifically, during the fifth to the eighth rotations (REV=5 to 8) and the ninth to the twelfth rotations (REV=9 to 12) of the substrate 15, the formatter 50 outputs the same data (modulation signal F1) at each rotation of the substrate 15 to draw by overwriting four times ($N_{OL}$=4) (lines LN2 and LN3, FIG. 14), and the lines LN2 and LN3 are separated by as much as the drawing pitch pw discussed earlier.

The track TR1 is drawn by drawing three lines (the number of lines $N_{LN}$=3) of the line LN1 (REV=1 to 4), LN2 (REV=5 to 8), and LN3 (REV=9 to 12; FIG. 14). Specifically, the profile of the electron beam is broad (usually gaussian in shape), and the dose profile (dose distribution) is varied by front and back scattering of the irradiation beam. The dose profile produced by the drawing (beam irradiation) of lines LN1, LN2, LN3 is accordingly synthesized therefrom, whereby the track TR1 is drawn as a synthesis of the lines LN1, LN2, LN3. The distance (pitch) between the lines LN1, LN2, LN3 is preferably set so that the lines LN1, LN2, LN3 drawn by irradiating a beam (the dose profiles produced by drawing adjacent lines) overlap.

In other words, the formatter 50 draws the track TR1 by making a grouping of a plurality of overwriting cycles (in the present embodiment, a three-part grouping of a plurality of lines LN1, LN2, LN3) without inserting the deflection adjustment period ($\Delta T$) discussed earlier ($\Delta T$=0). The distance between adjacent drawing lines among this plurality of drawing lines is preferably set so that the dose profiles of the lines overlap.

After drawing the track TR1, the formatter 50 blanks the electron beam to form a space between tracks of four times the drawing pitch pw during the thirteenth to the sixteenth rotations (REV=13 to 16), the seventeenth to the twentieth rotations (REV=17 to 20), the twenty-first to the twenty-fourth rotations (REV=21 to 24), and the twenty-fifth to the twenty-eighth rotations (REV=25 to 28) of the substrate 15.

Next, the formatter 50 performs the same control as when drawing the lines LN1 to LN3 to overwrite and draw the track TR2.

The period during which the electron beam is blanked to form a space between tracks (the non-drawing period) may be set as desired, but is preferably a period (a number of revolutions) corresponding to an integral multiple of the drawing pitch of concentric circles.

Thus, under the control of the formatter 50, an electron beam is deflected to overwrite drawing data synchronized with a translation synchronization signal so that so that the beam spot of the electron beam follows the translation of the substrate during a period in which the substrate is caused to rotate no more than a predetermined number of overwriting cycles synchronized with a rotation synchronization signal. The electron beam is then blanked to form a space between tracks during a period corresponding to an integral multiple of the drawing pitch of concentric circles.

Therefore, according to the present embodiment, the dose of each track Tri (i=1, 2, . . . ) can be increased to $4 \times N_{OL}$ times the dose when not overwriting (where $N_{OL}$ is number of line overwriting cycles, and is an integer of 2 or greater, which can be set as desired), noise or random components during drawing can be eliminated, and highly precise drawing can be carried out with a high S/N ratio. Having a track be composed of a plurality of lines also allows a gaussian-shaped electron beam to draw the edges of the track sharply.

Fourth Embodiment

Forming tracks circles accurately connected at connecting points Ci was discussed in the first and second embodiments, but the connecting points Ci of the tracks may also be within a non-drawing zone.

Figure 15:
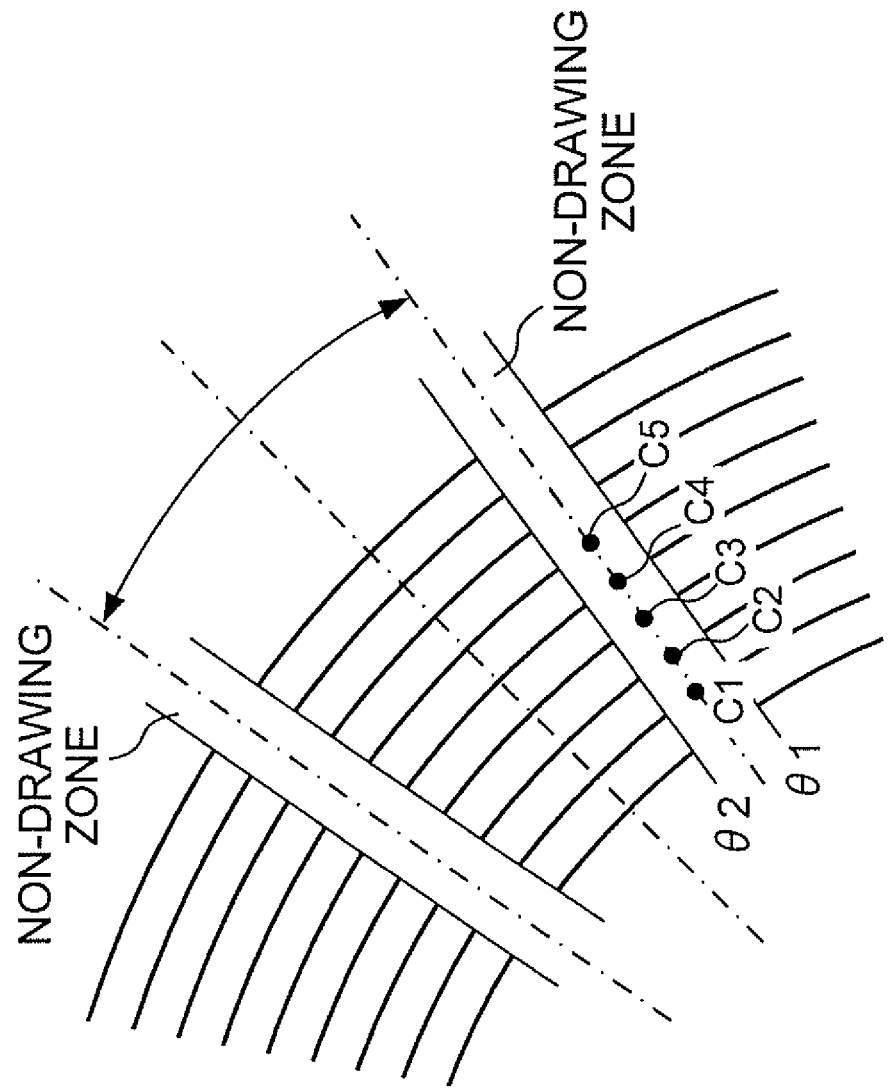
FIG. 15 is a schematic view of connecting points of tracks in the fourth embodiment of the present invention, where the connecting point Ci of each track is disposed in a non-drawing zone.

FIG. 15 illustrates a fourth embodiment of the present invention. The connecting point Ci (i=1 to 5) of each track has been disposed in a non-drawing zone of a predetermined angle zone of the substrate 15 (for example, the zone [$\theta 1$ to $\theta 2$]). Specifically, the formatter 50 adjusts the drawing start signal F6, the rotation clock signal F5, and the translation clock signal F4, for example, to control the connecting points Ci of the tracks to be located within the non-drawing zone.

Such a configuration prevents any adverse effect arising if the connecting points Ci are not accurately connected at the tracks, or are shifted from the same angle position and not on a straight line.

Depending on the format of a disk, such a non-drawing zone may not be available. In such case, the connecting points Ci are preferably controlled to be located within a specific area of the optical pattern; for example, an area where low precision is permitted. As discussed earlier, an area where low precision is permitted may be a preamble portion of a disk disposed continuously radially, for example. Specifically, performing the control so that the connecting points Ci are located in a preamble portion produces few adverse effects even if the tracks are not accurately connected at the connecting points Ci.

The servo area of patterned media (for example, discrete track media or bit pattern media) may be circular arc in shape. Hence, the connecting points Ci of the tracks may be arranged in an circular-arc shape in accordance with the shape of the servo area. Therefore, according to the present embodiment, drawing by overwriting tracks of concentric circles can eliminate random components when drawing the tracks and enable accurate drawing to be performed at a high S/N ratio. Providing a blank period (non-drawing period) after drawing one track and before drawing the next track also makes it possible to draw accurately connected tracks of concentric circles.

The control by the formatter 50 discussed above can also be performed by a computer program. Specifically, it is possible to use a computer program that includes commands or codes indicating control signals; namely, the modulation signal F1, the deflection signal F3, the translation clock signal F4, the rotation clock signal F5, the drawing start signal F6, the drawing end signal F7, and so forth. The computer program can also be performed by a processor to generate these control signals so as to control an electron beam recording apparatus.

As discussed in detail above, changing the settings for the various control signals in the electron beam recording apparatus (EBR) of the present invention and the controller (formatter) of the EBR makes it possible to readily change or set the number of overwriting cycles, the dose, the track pitch, the number of tracks, or other drawing parameters. The present invention is accordingly able to provide an electron beam recording apparatus capable of drawing concentrically circular tracks at a high level of precision and having a high degree of freedom and excellent control; as well as a controller, a control method, and a computer program product for the electron beam recording apparatus.

The invention claimed is:

1. A controller of an electron beam recording apparatus for irradiating an electron beam and drawing a concentrically circular pattern on a substrate while the substrate is rotated and translated, the controller comprising:
a deflection signal generator for generating a deflection signal for causing said electron beam to deflect and perform overwriting so that a beam spot of said electron beam follows the translation of said substrate over a period during which said substrate is rotated over a predetermined number of overwriting cycles; and
a data output unit for outputting drawing data,
wherein said deflection signal generator generates a deflection adjustment signal for causing said electron beam to deflect over a predetermined deflection adjustment period to a starting position for drawing of a new pattern to be subsequently overwritten after overwriting of one pattern based on said drawing data has completed, the starting position being further forward in the drawing direction relative to a point on a drawing track of a concentrically circular pattern where the overwriting of said one pattern has completed, and
a connection area of a concentric circle of said concentrically circular pattern is set so as to be within a non-drawing zone of said substrate or within an area of said substrate where low precision is permitted.

2. The controller according to claim 1, further comprising a setting unit for setting said number of overwriting cycles, wherein said deflection signal generator generates said deflection signal according to said set number of overwriting cycles.

3. The controller according to claim 1, wherein said deflection adjustment period is a period over which said substrate performs one rotation.

4. The controller according to claim 1, wherein said deflection adjustment period is shorter than the period over which said substrate performs one rotation.

5. The controller according to claim 1, wherein said deflection signal is a signal having a sawtooth waveform.

6. The controller according to claim 1, wherein said area where low precision is permitted is a preamble drawing area.

7. A non-transitory computer-readable storage medium having embodied thereon a program for a computer used to control drawing by an electron beam recording apparatus for irradiating an electron beam and drawing a concentrically circular pattern on a substrate based on drawing data while the substrate is rotated and translated, wherein the program is designed to cause said computer to execute:
a step for generating a deflection signal for causing said electron beam to deflect and perform overwriting so that an irradiation position of said electron beam follows the translation of said substrate over a period during which said substrate is rotated over a predetermined number of cycles, and for generating a deflection adjustment signal for causing said electron beam to deflect over a predetermined deflection adjustment period to a starting position for drawing of a new pattern to be overwritten after overwriting of one pattern based on said drawing data has completed, the starting position being further forward in the drawing direction relative to a point on a drawing track of a concentrically circular pattern where the overwriting of said one pattern has completed; and
a step for issuing an output command for outputting said drawing data over said predetermined number of cycles, wherein:
a connection area of a concentric circle of said concentrically circular pattern is set so as to be within a non-drawing zone of said substrate or within an area of said substrate where low precision is permitted.

8. The computer-readable storage medium according to claim 7, further comprising a step for receiving an instruction regarding said predetermined number of cycles,
wherein said step for generating a deflection signal generates said deflection signal according to said predetermined number of cycles.

9. The computer-readable storage medium according to claim 7, wherein said deflection adjustment period is the period over which said substrate performs one rotation.

10. The computer-readable storage medium according to claim 7, wherein said deflection adjustment period is shorter than the period over which said substrate performs one rotation.

11. The computer-readable storage medium according to claim 7, wherein a signal having a sawtooth waveform is generated in said step for generating a deflection signal.

12. The computer-readable storage medium according to claim 7, wherein each of a plurality of drawing lines is overwritten in said step for generating a deflection signal, and a gap between adjacent drawing lines of said plurality of drawing lines is set so that dose profiles of said drawing lines overlap.

13. The computer-readable storage medium according to claim 7, wherein said area where low precision is permitted is a preamble drawing area.

14. An electron beam recording apparatus for translating a substrate along a radius direction thereof while rotating said substrate, irradiating an electron beam while deflecting said electron beam based on drawing data, and drawing concentrically circular pattern on said substrate, the electron beam recording apparatus comprising:
a deflection signal generator for generating a deflection signal for causing said electron beam to deflect and perform overwriting so that a beam spot of said electron beam follows the translation of said substrate over a period during which said substrate is rotated over a predetermined number of overwriting cycles;
a data output unit for repeatedly outputting said drawing data according to said number of overwriting cycles;
a rotation and translation drive unit for rotating and translating said substrate;
an electron beam deflector for deflecting said electron beam in accordance with said deflection signal; and
an electron beam modulator for drawing an electron beam in accordance with said drawing data output from said data outputting section,
wherein said deflection signal generator generates a deflection adjustment signal for causing said electron beam to deflect over a predetermined deflection adjustment period to a starting position for drawing of a new pattern to be overwritten after overwriting of one pattern based on said drawing data has completed, the starting position being further forward in the drawing direction relative to a point on a drawing track of a concentrically circular pattern where the overwriting of said one pattern has completed, and wherein said deflection adjustment period is set so that a connection area of a concentric circle of said concentrically circular pattern is connected is within a non-drawing zone of said substrate or within an area of said substrate where low precision is permitted.

15. The electron beam recording apparatus according to claim 14, further comprising a setting unit for setting said number of overwriting cycles, wherein said deflection signal generator generates said deflection signal according to said set number of overwriting cycles.

16. The electron beam recording apparatus according to claim 14, wherein said deflection adjustment period is the period over which said substrate performs one rotation.

17. The electron beam recording apparatus according to claim 14, wherein said deflection adjustment period is shorter than the period over which said substrate performs one rotation.

18. The electron beam recording apparatus according to claim 14, wherein a signal for synchronizing said translation has a constant frequency over the period during which said substrate is rotated a predetermined number of overwriting cycles; and said deflection signal is a signal having a sawtooth waveform.

19. The electron beam recording apparatus according to claim 14, wherein said deflection signal generator overwrites each of a plurality of drawing lines, and a gap between adjacent drawing lines of said plurality of drawing lines is set so that dose profiles of said drawing lines overlap.

20. The electron beam recording apparatus according to claim 14, characterized in that said area where low precision is permitted is a preamble drawing area.

21. The controller according to claim 1, comprising a blanking control unit for blanking said electron beam, wherein said blanking control unit blanks said electron beam during said deflection adjustment period.

22. The computer-readable storage medium according to claim 7, wherein the step for generating said deflection adjustment signal blanks said electron beam during said deflection adjusting period.

23. The electron beam recording apparatus according to claim 14, further comprising a blanking control unit for blanking said electron beam, wherein said blanking control unit blanks said electron beam during said deflection adjustment period.

24. A controller of an electron beam recording apparatus for irradiating an electron beam, and drawing a concentrically circular pattern on a substrate based on drawing data while the substrate is rotated and translated, the controller comprising:
a deflection signal generator for generating a deflection signal for causing said electron beam to deflect and perform overwriting so that a beam spot of said electron beam follows the translation of said substrate over a period during which said substrate is rotated over a predetermined number of overwriting cycles; and
a data output unit for outputting said drawing data,
wherein said deflection signal generator generates a deflection adjustment signal for causing said electron beam to deflect to a starting position for drawing of a new pattern to be overwritten after overwriting of one pattern based on said drawing data has completed, said electron beam being deflected over a deflection adjustment period that is a period over which the substrate makes one rotation, and
said deflection adjustment period is set so that a connection area of a concentric circle of said concentrically circular pattern is within a non-drawing zone of said substrate or within an area of said substrate where low precision is permitted.

25. A non-transitory computer-readable storage medium having embodied thereon a program for a computer used to control drawing by an electron beam recording apparatus for irradiating an electron beam and drawing a concentrically circular pattern on a substrate while said substrate is rotated and translated, wherein the program is designed to make said computer execute:
a step for generating a deflection signal for causing said electron beam to deflect and perform overwriting so that a beam spot of said electron beam follows the translation of said substrate over a period during which said substrate is rotated over a predetermined number of overwriting cycles;
a step for generating a deflection adjustment signal for causing said electron beam to deflect to a starting position for drawing of a new pattern to be overwritten after overwriting of one pattern based on said drawing data has completed, said electron beam being deflected over a deflection adjustment period that is a period over which the substrate makes one rotation; and
a step for issuing an output command for outputting said drawing data over said predetermined number of cycles,
wherein a connection area of a concentric circle of said concentrically circular pattern is set so as to be within a non-drawing zone of said substrate or within an area of said substrate where low precision is permitted.

26. An electron beam recording apparatus for irradiating an electron beam, and drawing a concentrically circular pattern on a substrate based on drawing data while the substrate is rotated and translated, the electron beam recording apparatus comprising:
a deflection signal generator for generating a deflection signal for causing said electron beam to deflect and perform overwriting so that a beam spot of said electron beam follows the translation of said substrate over a period during which said substrate is rotated over a predetermined number of overwriting cycles;
a data output unit for repeatedly outputting said drawing data according to said number of overwriting cycles;
a rotation and translation drive unit for rotating and translating said substrate;
an electron beam deflector for deflecting said electron beam in accordance with said deflection signal; and
an electron beam modulator for drawing an electron beam in accordance with said drawing data outputted by said data outputting section,
wherein said deflection signal generator generates a deflection adjustment signal for causing said electron beam to deflect to a starting position for drawing of a new pattern to be overwritten after overwriting of one pattern based on said drawing data has completed, said electron beam being deflected over a deflection adjustment period that is a period over which the substrate makes one rotation, and
said deflection adjustment period is set so that a connection area of a concentric circle of said concentrically circular pattern is within a non-drawing zone of said substrate or within an area of said substrate where low precision is permitted.

* * * * *